United States Patent
Suzuki et al.

(10) Patent No.: US 7,670,856 B2
(45) Date of Patent: Mar. 2, 2010

(54) NITRIDE SEMICONDUCTOR SUBSTRATE AND METHOD OF MAKING SAME

(75) Inventors: Takayuki Suzuki, Hitachi (JP); Takeshi Meguro, Kitaibaraki (JP)

(73) Assignee: Hitachi Cable, Ltd., Tokyo (JP)

( * ) Notice: Subject to any disclaimer, the term of this patent is extended or adjusted under 35 U.S.C. 154(b) by 223 days.

(21) Appl. No.: 11/977,704

(22) Filed: Oct. 25, 2007

(65) Prior Publication Data

US 2008/0157282 A1    Jul. 3, 2008

(30) Foreign Application Priority Data

Dec. 28, 2006   (JP)   ............................. 2006-355008

(51) Int. Cl.
*H01L 21/8252* (2006.01)

(52) U.S. Cl. .................... 438/4; 438/46; 257/E21.697; 257/615

(58) Field of Classification Search ................. 257/103, 257/189, 190, 615, 1, 618, 621, E21.085, 257/E21.697; 438/4, 22, 46, 502
See application file for complete search history.

(56) References Cited

U.S. PATENT DOCUMENTS

| | | | |
|---|---|---|---|
| 6,413,627 | B1 | 7/2002 | Motoki et al. |
| 2001/0049201 | A1 | 12/2001 | Park |
| 2002/0028564 | A1 | 3/2002 | Motoki et al. |
| 2002/0197825 | A1 | 12/2002 | Usui et al. |

FOREIGN PATENT DOCUMENTS

| | | | |
|---|---|---|---|
| JP | 2002-29897 | | 1/2002 |
| JP | 2002-57119 | | 2/2002 |
| JP | 2004059363 | A * | 2/2004 |
| JP | 3631724 | | 12/2004 |
| JP | 3744155 | | 12/2005 |
| JP | 3788041 | | 4/2006 |

OTHER PUBLICATIONS

Abstract only of Japanese Patent 11-145057 dated May 28, 1999.

* cited by examiner

*Primary Examiner*—Victor A Mandala
*Assistant Examiner*—Scott Stowe
(74) *Attorney, Agent, or Firm*—Scully, Scott, Murphy & Presser, P.C.

(57) ABSTRACT

A method of making a nitride semiconductor substrate having the steps of providing a free-standing substrate that is of a nitride semiconductor and has one of a penetrating pit and a penetrating crack that penetrate from a top surface to a back surface of the free-standing substrate, attaching a metal to the penetrating pit or the penetrating crack, the metal being adapted to be nitrided, and nitriding the metal to form a nitride that seals the penetrating pit or the penetrating crack. A nitride semiconductor substrate has a free-standing substrate that is formed of a nitride semiconductor and has one of a penetrating pit and a penetrating crack that penetrate from a top surface to a back surface of the free-standing substrate, and a metal nitride that seals the penetrating pit or the penetrating crack. The metal nitride is formed of GaN, InN and AlN.

6 Claims, 1 Drawing Sheet

NITRIDE SEMICONDUCTOR SUBSTRATE AND METHOD OF MAKING SAME

The present application is based on Japanese patent application No. 2006-355008 filed on Dec. 28, 2006, the entire contents of which are incorporated herein by reference.

BACKGROUND OF THE INVENTION

1. Field of the Invention

This invention relates to a method of making a nitride semiconductor substrate composed of $In_XAl_YGa_{1-X-Y}N$: $0 \leq X \leq 1$, $0 \leq Y \leq 1$, and $0 \leq X+Y \leq 1$, and a nitride semiconductor substrate made by the method.

2. Description of the Related Art

Nitride semiconductor crystals are very difficult to grow in bulk form from a melt by boat method or Czochralski method since nitrogen has a very high vapor pressure. A very small substrate can be only obtained by these methods to use the principle where desorption of group V element is suppressed by applying high pressure. For this reason, a nitride semiconductor substrate, so-called "free-standing substrate" is produced such that a nitride semiconductor layer is grown mainly by vapor growth method on a hetero-substrate such as a sapphire substrate, a silicon substrate and a gallium arsenide substrate which is made of a material different from the nitride semiconductor, and the hetero-substrate is then removed by grinding, etching or peeling etc. so that only the grown nitride semiconductor layer remains.

For example, methods for producing the free-standing substrate are disclosed in JP-A-2002-57119, JP-B-3631724, JP-B-3744155 and JP-B-3788041.

Some methods are conducted such that only one free-standing substrate is taken from the remaining nitride semiconductor layer after removing the hetero-substrate. However, JP-A-2002-29897 discloses a method that a thick nitride semiconductor layer is epitaxially grown and is then sliced to yield plural free-standing substrates.

Herein, "free-standing substrate" means all free-standing substrates as produced by the above methods.

Vapor growth methods as mentioned earlier are generally used to grow the free-standing substrate. Of them, HVPE (hydride vapor phase epitaxy) is in general deemed to be fast in crystal growth rate and most suitable in industrial production. The details of HVPE are described in JP-A-2002-57119, JP-B-3631724, JP-B-3744155, JP-B-3788041 and JP-A-2002-29897. Of the other methods, MOVPE (metalorganic vapor phase epitaxy) is not suited to produce a thick film such as the free-standing substrate since its growth rate cannot be increased so much. The other methods include the known sublimation method and liquid phase growth method, which are not generally available to grow the free-standing substrate.

Where a nitride semiconductor layer is grown on a hetero-substrate such as sapphire having a lattice constant significantly different from that of nitride semiconductor, it cannot be epitaxially grown while coherently inheriting the lattice structure of the hetero-substrate. Therefore, the crystal growth process is developed such that nuclei for the crystal growth are first generated at some positions on the hetero-substrate, crystals are then gradually grown originating at the nuclei, and the adjacent crystals are then connected to form a planarly continuous film with a flat surface. In order to lower the dislocation density of the crystal obtained by the above process, it is desired to lower the density of nuclei generated initially. However, if the density of nuclei generated lowers, the connection frequency of adjacent crystals is reduced so that it becomes difficult to obtain the planarly continuous film with a uniform thickness. This may cause a relatively steep recess in the direction from the top surface to the back surface of the film.

Where the free-standing substrate obtained by removing the hetero-substrate is ground to have a desired thickness, the grinding is generally conducted simultaneously at a surface (hereinafter called "top surface" of the substrate) on the growth side of the nitride semiconductor as well as at a surface (hereinafter called "back surface" of the substrate) on the side of the hetero-substrate removed. If the degree of grinding at the back surface is high, there may be formed a penetrating pit which penetrates from the top surface to the back surface of the substrate. Further, where the steep recesses as described above are linearly connected together like a crack, there may be formed a penetrating crack which penetrates from the top surface to the back surface of the substrate. Even if only one penetrating pit or penetrating crack is formed in the substrate, the substrate cannot be held by vacuum suction during the device fabrication process such as epitaxially growing a semiconductor layer on the substrate. In other words, it is useless to transfer the defective substrate to the device fabrication process.

Thus, since the substrate having such a penetrating pit or penetrating crack is substantially useless in the device fabrication process even when being transferred thereto, the production yield of the substrate will be significantly reduced.

SUMMARY OF THE INVENTION

It is an object of the invention to provide a method of making a nitride semiconductor substrate that allows a substrate with a penetrating pit or penetrating crack to be used in the device fabrication process so as to enhance the production yield of the substrate.

It is a further object of the invention to provide a nitride semiconductor substrate that is constructed to be used in the device fabrication process even when having the penetrating pit or penetrating crack.

(1) According to one embodiment of the invention, a method of making a nitride semiconductor substrate comprises:

providing a free-standing substrate that comprises a nitride semiconductor and one of a penetrating pit and a penetrating crack that penetrate from a top surface to a back surface of the free-standing substrate;

attaching a metal to the penetrating pit or the penetrating crack, the metal being adapted to be nitrided; and nitriding the metal to form a nitride that seals the penetrating pit or the penetrating crack.

In the above embodiment (1), the following modifications, changes and a combination thereof as mentioned in (i) to (iii) can be made.

(i) The metal comprises one of gallium, indium and aluminum.

(ii) The nitriding of the metal is conducted by heating the free-standing substrate at temperature in a range of 300° C. to 1200° C. in an atmosphere comprising ammonia ($NH_3$) gas.

In the above method, if the heating temperature is lower than 300° C., the nitriding of the metal cannot be developed effectively. On the other hand, if the heating temperature is higher than 1200° C., the etching reaction on the surface of the free-standing substrate becomes too intensive so that the surface must be roughened.

(iii) The nitriding of the metal is conducted in an atmosphere comprising an ammonia ($NH_3$) gas plasma or a plasma and ammonia ($NH_3$) gas.

(2) According to another embodiment of the invention, a nitride semiconductor substrate comprises:

a free-standing substrate that comprises a nitride semiconductor and one of a penetrating pit and a penetrating crack that penetrate from a top surface to a back surface of the free-standing substrate; and a metal nitride that seals the penetrating pit or the penetrating crack.

In the above embodiment (2), the following modifications, changes and a combination thereof as mentioned in (iv) can be made.

(iv) The metal nitride comprises one of GaN, InN and AlN.

Hetero-substrates used for the growth of the free-standing substrate can be various materials. In practical use, other than a sapphire substrate, a material such as silicon carbide, silicon and gallium arsenide is preferably used which has a relatively high lattice matching property to nitride semiconductors or has been conventionally used and has a good track record in epitaxial growth.

Further, even when a substrate has a deep recess on its surface although it has no penetrating pit or penetrating crack, the recess may be changed into a penetrating pit or penetrating crack. Therefore, the invention can be preferably applied such that the recess is sealed or filled in advance.

ADVANTAGES OF THE INVENTION

In accordance with the invention, a metal adapted to be nitrided is attached to the penetrating pit or the penetrating crack, and the metal is then nitrided to form a nitride that seals the penetrating pit or the penetrating crack. The abovementioned problem can be solved that it is useless to transfer a substrate with a penetrating pit or penetrating crack to the following device fabrication process since the defective substrate cannot be held by vacuum suction during the device fabrication process. Thus, the valuable and expensive nitride semiconductor substrate can be used efficiently to significantly enhance the production yield.

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

The preferred embodiment according to the invention will be describe below.

A nitride semiconductor free-standing substrate used for the invention is preferably formed of a nitride semiconductor that is not doped with any impurity (i.e., undoped), or is an n-type or p-type in conductivity type and not more than $1 \times 10^{20}$ $cm^{-3}$ in carrier concentration. Also, it is preferably not less than 100 µm in film thickness so that it can be stably free-standing to facilitate the handling thereof.

The invention applies to the free-standing substrate as mentioned above and having a penetrating pit or penetrating crack. A method of the invention is composed of (i) attaching a metal adapted to be nitrided to the penetrating pit or penetrating crack, and (ii) then nitriding the metal to form the nitride such that the penetrating pit or penetrating crack is sealed with the nitride.

By using the method of the invention, the nitride semiconductor free-standing substrate can be sufficiently utilized although it was so far unavailable due to having the penetrating pit or penetrating crack. Therefore, the production yield of the free-standing substrate can be significantly improved.

EXAMPLES

Examples 1-5 of the method of making a nitride semiconductor substrate according to the invention will be explained below. However, the invention is not limited to Examples 1-5.

Example 1

Figure 1:
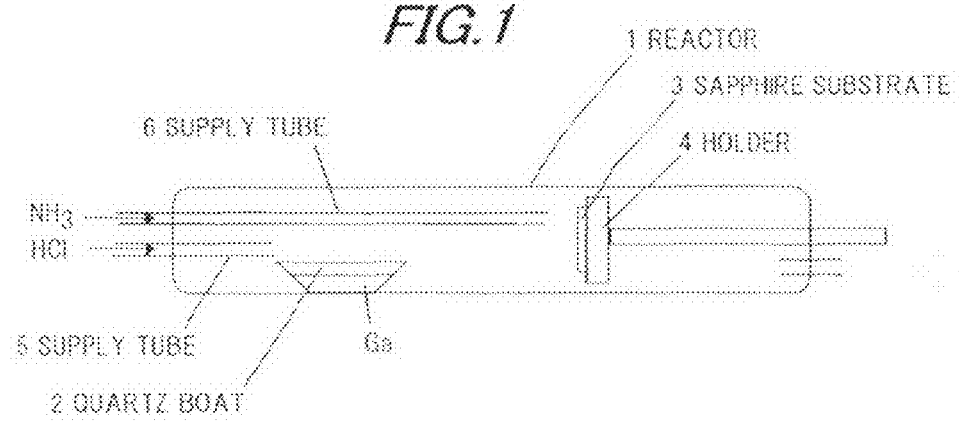
FIG. 1 is a schematic side view showing an HVPE apparatus for the crystal growth of a GaN free-standing substrate.

As a crystal growth apparatus, an HVPE apparatus as shown in FIG. 1 is used. The HVPE apparatus is composed of a quartz reactor 1 in which reaction gas flows unidirectionally from an upstream side to a downstream side of the reactor 1, and a quartz boat 2 which is disposed relatively near a gas inlet inside the reactor 1 and in which metal gallium (Ga) is contained. On the other hand, at a position distant from the quartz boat 2 on the downstream side of the reactor 1, a 2-inch φ sapphire substrate 3 is placed on a carbon susceptor (or substrate fixing base) 4 to be perpendicular to the direction of the reaction gas flow. Further, a supply tube 5 for halogen gas (HCl) is disposed at a position close to the quartz boat 2 containing the metal gallium, and another supply tube 6 for hydride gas ($NH_3$) is disposed at a position close to the sapphire substrate 3.

In operating the reactor 1, hydrogen chloride (HCl) gas is introduced together with hydrogen carrier gas into the reactor 1 through the halogen gas supply tube 5. In this period, the quartz boat 2 containing the metal Ga is heated to 900° C. and the sapphire substrate 3 is heated to 510° C. Then, gallium chloride (GaCl) is produced by reacting the HCl gas with the metal Ga and, on the other hand, ammonia ($NH_3$) gas is introduced together with nitrogen carrier gas into the reactor 1 through the hydride supply tube 6 close to the sapphire substrate 3 such that these source gases are reacted with each other on the sapphire substrate 3 to grow a GaN buffer layer with a thickness of 30 nm.

After the growth of the GaN buffer layer, the temperature of the sapphire substrate 3 is increased to 1050° C. and the growth process is then conducted at a growth rate of 100 µm/h for 3 hours to grow a GaN film with a thickness of 300 µm on the buffer layer.

Then, the epitaxial wafer with the GaN film grown on the sapphire substrate is taken out of the reactor 1 and moved to a grinding apparatus, where its sapphire substrate side is lapped by using a diamond abrasive to remove the sapphire substrate and the buffer layer. Then, it is polished by using a finer diamond abrasive to produce a GaN free-standing substrate with a thickness of 270 µm.

Figure 2:
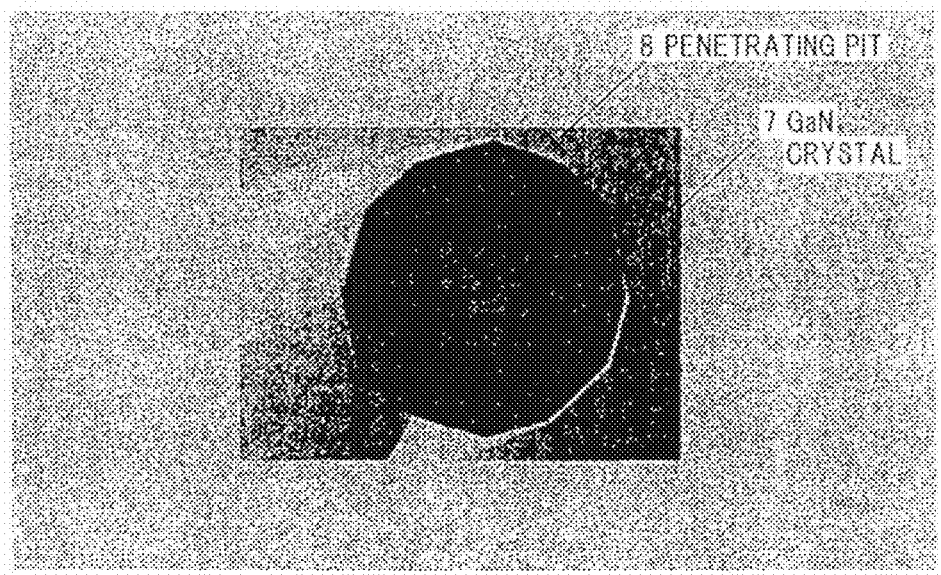
FIG. 2 is a closeup photograph showing a penetrating pit existing on the surface of the GaN free-standing substrate.

Of the plural GaN free-standing substrates thus produced, one with a penetrating pit is selected and observed. FIG. 2 is a microscope photograph zooming in the surface of the selected GaN free-standing substrate, where 7 is GaN crystal as a matrix and 8 is the penetrating pit which appears to be a black circle.

Then, a small amount of liquid gallium (which is kept in liquid form at temperature slightly higher than room temperature) is injected into the penetrating pit 8. This process is conducted by using an injector with a positioning mechanism and a special discharge nozzle while observing the surface of the GaN free-standing substrate by viewing it through a relatively low-power microscope. The liquid gallium is solidified at room temperature by being cooled after the injection and attached to the inside of the penetrating pit.

Then, the GaN free-standing substrate with the gallium solidified in the penetrating pit is placed in a heating furnace and heated at 500° C. for 1 hour while flowing $NH_3$ gas at a flow rate of 5 L/min controlled by a mass flow controller together with hydrogen gas at the same flow rate.

Although the gallium in the penetrating pit 8 is liquidized again when the substrate temperature increases, it can be retained inside the penetrating pit 8 without being flown out of there due to surface tension thereof. This phenomenon is common to the other metals such as indium and aluminum.

As a result, the gallium is nitrided to allow the formation of GaN polycrystal to seal the penetrating pit 8.

Meanwhile, as anticipated, it is difficult to have a good device property near a sealed position of the GaN free-standing substrate where the penetrating pit is sealed with the GaN polycrystal. However, most part of the in-plane region except the vicinity of the sealed position of the GaN free-standing substrate can offer a good device property. Thus, many good devices can be fabricated even from the defective free-standing substrate that was so far unavailable in the device fabrication process. Therefore, the production yield of the GaN free-standing substrate can be significantly improved.

Example 2

Of the plural GaN free-standing substrates produced in a similar way to Example 1, one predominantly with a penetrating crack is selected. Then, a small amount of liquid gallium is injected into the penetrating crack. This process is conducted by using the same injector as Example 1.

Then, the GaN free-standing substrate with the gallium solidified in the penetrating crack is placed in the heating furnace and heated at 500° C. for 1 hour while flowing $NH_3$ gas at a flow rate of 5 L/min controlled by the mass flow controller together with nitrogen gas at the same flow rate.

As a result, the gallium is nitrided to allow the formation of GaN polycrystal to seal the penetrating crack.

Thus, as well as Example 1, many good devices can be fabricated even from the defective free-standing substrate that was so far unavailable in the device fabrication process. Therefore, the production yield of the GaN free-standing substrate can be significantly improved.

Example 3

Of the plural GaN free-standing substrates produced in a similar way to Example 1, one with a penetrating pit is selected. Then, a small indium ball is attached to the penetrating pit. This process is conducted manually by carefully using tweezers with a special tip portion which does not stick to the indium while observing the surface of the GaN free-standing substrate by viewing it through a relatively low-power microscope. To make the manual process more efficient, some tool like one used in Examples 1 and 2 can be assembled. Same applies to Example 4 as described later.

Then, the GaN free-standing substrate with the indium attached to the penetrating pit is placed in the heating furnace and heated at 500° C. for 1 hour while flowing $NH_3$ gas at a flow rate of 7 L/min controlled by the mass flow controller together with hydrogen gas at a flow rate of 3 L/min.

As a result, the indium is nitrided to allow the formation of InN polycrystal to seal the penetrating pit.

Thus, as well as Example 1, many good devices can be fabricated even from the defective free-standing substrate that was so far unavailable in the device fabrication process. Therefore, the production yield of the GaN free-standing substrate can be significantly improved.

Example 4

Of the plural GaN free-standing substrates produced in a similar way to Example 1, one with a penetrating crack is selected. Then, shredded pieces of a fine aluminum wire are deposited on plural positions along the penetrating crack. This process is conducted manually by carefully using fine tweezers while observing the surface of the GaN free-standing substrate by viewing it through a relatively low-power microscope.

Then, the GaN free-standing substrate with the aluminum wires deposited on the penetrating crack is placed in the heating furnace and heated at 700° C. for 1.5 hour while flowing $NH_3$ gas at a flow rate of 10 L/min controlled by the mass flow controller.

As a result, the aluminum is nitrided to allow the formation of AlN polycrystal to seal the penetrating crack.

Thus, as well as Example 1, many good devices can be fabricated even from the defective free-standing substrate that was so far unavailable in the device fabrication process. Therefore, the production yield of the GaN free-standing substrate can be significantly improved.

Example 5

Of the plural GaN free-standing substrates produced in a similar way to Example 1, one with a penetrating pit is selected. Then, a small amount of liquid gallium is injected into the penetrating pit. This process is conducted by using the same injector as Example 1.

Then, the GaN free-standing substrate with the gallium solidified in the penetrating pit is placed in a chamber of a plasma generator with parallel plate electrodes and plasma-treated at a discharge power of 300 W for 0.5 hours and at a pressure of 0.5 Pa while flowing $NH_3$ gas inside the chamber at a flow rate of 2 L/min controlled by the mass flow controller and heating the free-standing substrate at 150° C.

As a result, the gallium is nitrided to allow the formation of GaN polycrystal to seal the penetrating pit.

Thus, as well as Example 1, many good devices can be fabricated even from the defective free-standing substrate that was so far unavailable in the device fabrication process. Therefore, the production yield of the GaN free-standing substrate can be significantly improved.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A method of making a nitride semiconductor substrate, comprising:
   providing a free-standing substrate that comprises a nitride semiconductor and one of a penetrating pit and a penetrating crack that penetrate from a top surface to a back surface of the free-standing substrate;
   attaching a metal to the penetrating pit or the penetrating crack, the metal being adapted to be nitrided; and
   nitriding the metal to form a nitride that seals the penetrating pit or the penetrating crack.

2. The method according to claim 1, wherein:
the metal comprises one of gallium, indium and aluminum.

3. The method according to claim 1, wherein:
the nitriding of the metal is conducted by heating the free-standing substrate at temperature in a range of 300° C. to 1200° C. in an atmosphere comprising ammonia ($NH_3$) gas.

4. The method according to claim 2, wherein:
the nitriding of the metal is conducted by heating the free-standing substrate at temperature in a range of 300° C. to 1200° C. in an atmosphere comprising ammonia ($NH_3$) gas.

5. The method according to claim 1, wherein:
the nitriding of the metal is conducted in an atmosphere comprising an ammonia ($NH_3$) gas plasma or a plasma and ammonia ($NH_3$) gas.

6. The method according to claim 2, wherein:
the nitriding of the metal is conducted in an atmosphere comprising an ammonia gas ($NH_3$) plasma or a plasma and ammonia ($NH_3$) gas.

* * * * *